United States Patent
Seban et al.

(10) Patent No.: US 9,699,913 B2
(45) Date of Patent: Jul. 4, 2017

(54) METHOD OF PRODUCING A DEVICE COMPRISING AT LEAST TWO DISTINCT COMPONENTS THAT ARE INTERCONNECTED BY INTERCONNECTING WIRES AND A DEVICE THEREBY OBTAINED

(75) Inventors: Frederick Seban, Cassis (FR); Jean-Christophe Fidalgo, Gemenos (FR)

(73) Assignee: GEMALTO SA, Meudon (FR)

( * ) Notice: Subject to any disclaimer, the term of this patent is extended or adjusted under 35 U.S.C. 154(b) by 782 days.

(21) Appl. No.: 12/747,427

(22) PCT Filed: Dec. 4, 2008

(86) PCT No.: PCT/EP2008/066829
§ 371 (c)(1),
(2), (4) Date: Jun. 10, 2010

(87) PCT Pub. No.: WO2009/077347
PCT Pub. Date: Jun. 25, 2009

(65) Prior Publication Data
US 2010/0276497 A1  Nov. 4, 2010

(30) Foreign Application Priority Data
Dec. 13, 2007 (EP) .................................... 07301673

(51) Int. Cl.
*G06K 19/06* (2006.01)
*H05K 3/10* (2006.01)
(Continued)

(52) U.S. Cl.
CPC .......... *H05K 3/103* (2013.01); *G06K 19/027* (2013.01); *G06K 19/07749* (2013.01);
(Continued)

(58) Field of Classification Search
CPC ...... G07F 7/1008; B42D 15/10; G06Q 20/341
(Continued)

(56) References Cited

U.S. PATENT DOCUMENTS

| 6,088,230 A * | 7/2000 | Finn et al. .................... 361/737 |
| 2005/0001785 A1 * | 1/2005 | Ferguson et al. ............. 343/895 |

(Continued)

FOREIGN PATENT DOCUMENTS

| DE | 41 38 131 A1 | 4/1993 |
| FR | 2 833 109 A1 | 6/2003 |
| JP | 2002-298110 A | 10/2002 |

OTHER PUBLICATIONS

International search Report (PCT/ISA/210) dated Apr. 17, 2009.
Written Opinion (PCT/ISA/237) dated Apr. 17, 2009.

*Primary Examiner* — Rafferty Kelly
(74) *Attorney, Agent, or Firm* — Buchanan Ingersoll & Rooney PC

(57) ABSTRACT

Method of producing a device comprising at least two distinct components that are interconnected by interconnecting wires, and device thereby obtained. The invention relates to a method of producing a device having at least two distinct components which are interconnected on a substrate by at least one interconnecting wire. The method includes the following steps: creating the interconnecting wire by depositing individual wires on the substrate in a predefined interconnecting pattern, the wire comprising at least one terminal connection portion which is exposed on the substrate, bringing at least one contact of a component to face the terminal portion and connecting the contact to this terminal portion. The invention also relates to the device thereby obtained and to a multi-component product comprising same.

21 Claims, 5 Drawing Sheets

(51) Int. Cl.
  *G06K 19/02*    (2006.01)
  *G06K 19/077*   (2006.01)
  *H01Q 1/22*     (2006.01)
  *H01Q 1/27*     (2006.01)
  *H05K 1/03*     (2006.01)
  *H05K 3/32*     (2006.01)
  *H05K 3/34*     (2006.01)
  *H05K 3/40*     (2006.01)

(52) U.S. Cl.
  CPC ............ *H01Q 1/2208* (2013.01); *H01Q 1/27* (2013.01); *H01L 2224/16225* (2013.01); *H05K 1/0393* (2013.01); *H05K 3/328* (2013.01); *H05K 3/3494* (2013.01); *H05K 3/4084* (2013.01); *H05K 2201/10287* (2013.01); *H05K 2203/0195* (2013.01); *H05K 2203/1189* (2013.01); *Y10T 29/49204* (2015.01)

(58) Field of Classification Search
  USPC .................................................. 235/487, 492
  See application file for complete search history.

(56) References Cited

U.S. PATENT DOCUMENTS

| | | | |
|---|---|---|---|
| 2006/0254811 A1* | 11/2006 | Kirstein et al. | 174/256 |
| 2006/0289469 A1 | 12/2006 | Chandra et al. | |
| 2007/0193021 A1* | 8/2007 | Kobayashi | G06K 19/07752 29/601 |
| 2008/0072423 A1* | 3/2008 | Finn | 29/854 |

\* cited by examiner section B-B

METHOD OF PRODUCING A DEVICE COMPRISING AT LEAST TWO DISTINCT COMPONENTS THAT ARE INTERCONNECTED BY INTERCONNECTING WIRES AND A DEVICE THEREBY OBTAINED

Method of producing a device comprising at least two distinct components that are interconnected by interconnecting wires and a device thereby obtained The invention relates to the field of components interconnection methods.

In particular, it relates to a method of producing a device comprising at least two distinct components that are interconnected on a substrate by interconnecting wires and a device thereby obtained The invention mainly relates to the manufacture of smart multi-component items in any form, such as for example integrated circuit card(s), passports, thin electronic inserts.

The object of this invention is to enable the economic and simple manufacture of multi-component items preferably having good mechanical strength properties, particularly flexural strength.

The current multi-component cards, particularly cards with batteries, micro-controllers or displays require the creation of an insert comprising etched interconnecting tracks in the form of a printed circuit. The components are then transferred and connected by welding or by conductive adhesive, if applicable. The base has the disadvantage of being rather rigid and the method rather expensive.

In addition, SMD type components to be connected, such as biometric sensors, are rather fragile and do not support the well known connection method by thermo-compression of a wire onto contact pads, a probe pressing on and providing thermal energy directly to the wire.

The patent application US2006/0254811 describes an electric circuit produced from a woven fabric, the warp and weft yarns of which include conductive wires. It is necessary to weld the warp and weft yarns together in order to change direction.

The invention in particular aims at solving the aforementioned disadvantages.

The invention also provides an economic and industrial solution for interconnecting components or for creating electronic circuits including interconnected components.

For this purpose, the invention relates to a method of producing a device comprising at least two distinct components that are interconnected on a substrate by at least one interconnecting wire. The method includes the following steps:
- creating the interconnecting wire (3) by depositing individual wires on the substrate (2, 2f, 2b) according to a predefined interconnecting pattern, said wire including at least one terminal connection portion (7, 8) which is exposed on the substrate,
- bringing at least one contact (5, 6) of a component (C1, C3) to face the terminal portion (7b, 8b) and connecting the contact to this terminal portion.

According to other preferred characteristics to enable the connection of fragile components:
- the terminal portion being coated with insulating material, the method comprises a step of exposing it first or during the connection;
- the exposure is obtained by flattening the terminal portion prior to the connection;
- the connection is made by a conductive adhesive (G) applied between the terminal portion (7c, 7p, 8c, 8p) and the contact.

In addition to the resolution of the aforementioned disadvantages, the invention enables flexibility in manufacturing the device through a decoupling of the manufacturing of interconnecting tracks from other conventional operations of insertion, particularly the prior transfer of the contact pads or component onto a substrate, the prior creation of a cavity under the portions to be connected, the coating of connections.

According to other implementation characteristics:
- the interconnecting wire is created by embroidering or sewing on a flexible substrate comprising a woven fabric and in that it comprises a step according to which a reinforcing material is placed in the form of a sheet or a layer on one face of the substrate to face the one carrying the terminal portions;
- the interconnecting wire is a hybrid wire 22 associated with at least one non-conductive wire;
- the reinforced layer or sheet is used after the creation of the interconnecting wire;
- the method includes a step of forming a cavity in the substrate and/or the reinforced sheet or layer near the terminal portions;

The invention also concerns a device comprising at least two distinct components on a substrate that are interconnected by at least one interconnecting track.

The device is characterised in that the track is produced by a wire technique on the substrate, said track including at least one terminal connection portion exposed on the substrate,
- at least one electric contact of a component being transferred to face the terminal portion and connected to this terminal portion.

According to other characteristics of the device:
- the wire having an insulating sheath, the terminal portion is exposed at the connection;
- the terminal portion includes a flat portion;
- the connection is made using a conductive adhesive (G) applied between the terminal portion and the contact;
- the interconnecting wire or track is created by embroidering or sewing on a flexible support comprising a woven fabric and a reinforcing material in the form of a sheet or a layer on one face of the substrate to face the one carrying the terminal portions,
- a cavity is provided in the substrate and/or the reinforced sheet or layer near the terminal portions;
- the interconnecting wire is a hybrid wire associated with at least one non-conductive wire.

The invention also relates to a multi-component electronic product, such as a smart card, a passport, including the aforementioned device or obtained according to the aforementioned method.

Other characteristics and advantages of the invention will become apparent upon reading the following description, given as an illustrative and non-exhaustive example, and referring to the appended figures in which:

FIG. 1 gives a schematic view of a device obtained using an implementation of the method of the invention;

Here it is a multi-component device including a biometric sensor C1, an OTP generator (single-use access code) C2 with a microcontroller, a switch C3, and a battery C5.

Component means any electric, electronic or electromechanical element. A simple isolated contact can also be considered, in certain cases, as an electric connecting component.

Figure 1:
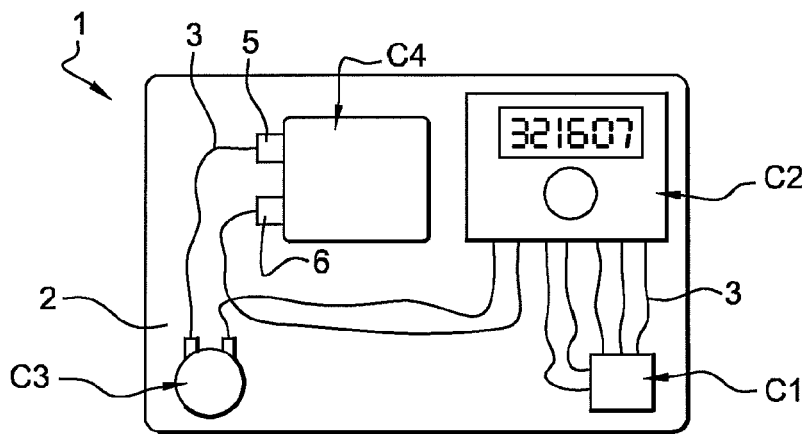
FIG. 1 shows a device including at least two distinct components C1 and C2 on a substrate and interconnected by at least one interconnecting track 3 created according to the implementation of the invention.
Figure 2:
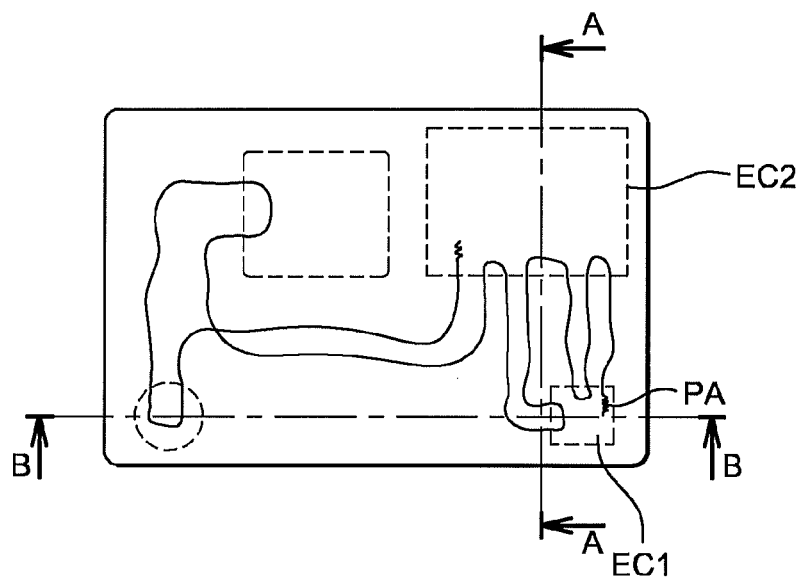
FIG. 2 shows the first step of creating interconnecting wires using an implementation of the method of the invention.

According to one embodiment, in FIG. 2, the tracks or interconnecting conductive wires 3 are created using a wire technique on the substrate, here embroidery. The wire techniques in the meaning of the invention include deposition or transfer techniques of individual long lineal conductive material on a substrate, such as embroidery, sewing, knitting, but also of the wire deposited by overlaying, notably by using ultrasound or glued on a substrate. The wire can be of any cross-section, including a parallelepiped cross-section for flat wire. The wire is continuous and homogenous between the connecting points thereof.

On the contrary, the tracks obtained by removal of metal: etching or cutting of a metallic sheet do not belong to the wire techniques.

The wire is preferably brought on a substrate according to an interconnecting method different from or independent of the substrate structure. The interconnecting wire is continuously provided as the same wire without welding or changing of the wire between two areas intended to receive connecting points.

Preferably, the substrate does not yet include the components or pads to be connected. However, the invention may provide for components or pads or tracks already on the substrate before the transfer of the wire.

So for example, connecting points on distinct warp and weft yarns of a woven fabric can be directly connected using a single straight or bent wire.

The interconnecting wire 3 includes at least one portion which is intended for the exposed connection on or in the substrate (according to another method mentioned hereinafter); After the embroidery, these portions rest on the substrate and are thus exposed to components to be connected.

The wires preferably extend beyond the planned connecting point inside the zones (EC1, EC2.) corresponding to the location of the wires (dotted lines).

According to a preferred embodiment, in order to optimise the rate of the step of transfer or creation of the interconnecting wires on the support, any discontinuity during the creation of a plurality of interconnecting wires is avoided. So the pattern drawn by the wire will not only be continuous between the components location zones (EC1, EC2.) but preferably also inside the zones.

So for example, the wire 3 forms continuous loops extending inside locations EC1 and EC2. The starting point PD of the wire is in zone EC2 and the ending point PA is in zone EC1 or vice versa. However, there can also be a starting point in one zone and an ending point PA in another for each interconnecting wire.

Should the case arise, there can be wire continuity between a plurality of continuous patterns, each pattern being intended to form interconnections for each device. The continuity particularly corresponds to patterns created by the same embroidering, sewing or overlaying head. This especially avoids having to make barring stitches with the embroidery yarn at the ends of each interconnecting wire or having to cut the wire, fly over an area, stop the ultrasounds or overlay the wire again.

The cuts of the components receiving areas or at least a portion supporting a wire portion will provide the "de-short-circuiting" or "non short-circuiting" of the interconnecting wires.

If necessary, the support may include wire portions extending between locations or in suitable locations just to secure continuity of the pattern; such portions may not be connected later on.

In summary, a pattern is created with a continuous wire intended to form at least two continuous interconnecting wires after the cutting thereof. The pattern is cut, at a later step, in order to form at least the two interconnecting wires and not short-circuit these two wires.

The cut is preferably carried out after a reinforcing material is fixed on the support and by also removing by way of cutting the support with the reinforcing material and a portion of the wire. The reinforcement aids the manipulation, the positioning and the cutting.

Figure 3:
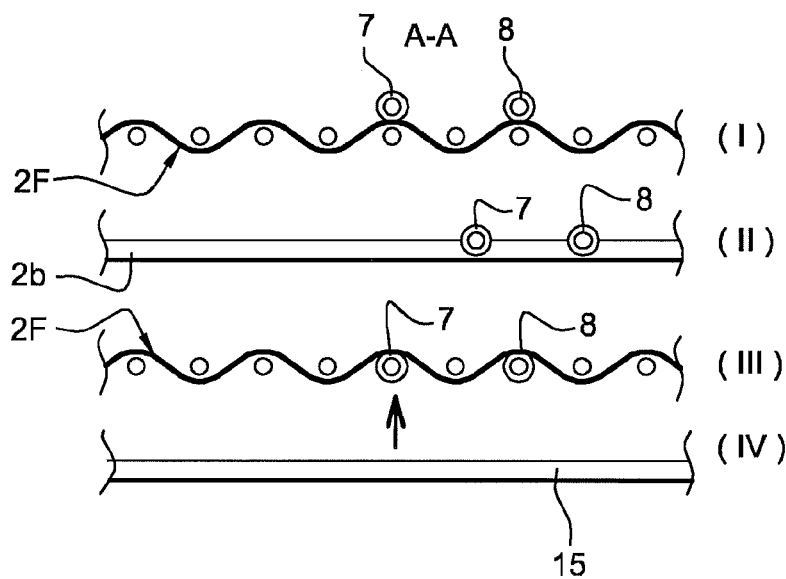
FIG. 3 shows a schematic view of various embodiments of interconnecting wires on a substrate according to the invention.

Three embodiments of the support with interconnecting wires are illustrated in FIG. 3. The first one (I) comprises a woven fabric substrate, the interconnecting wires being embroidered; the second one (II) comprises a plastic or paper substrate, the interconnecting wires being created in overlaid wires or deposited using ultrasounds; the third one (III) (which does not correspond to FIG. 2) comprises a woven fabric substrate, the interconnecting wires being in the woven fabric as warp and/or weft yarns; the wires can also be fixed beforehand, at predetermined points on a substrate.

Preferably, a reinforcing or stabilising material, 15, is laminated and fixed against the woven fabric substrates (I, III).

On the device, at least one contact (5, 6) of one of the components is transferred to face each terminal portion (7, 8, 7b, 8b) and is connected to this terminal portion according to various methods as subsequently explained.

Figure 4:
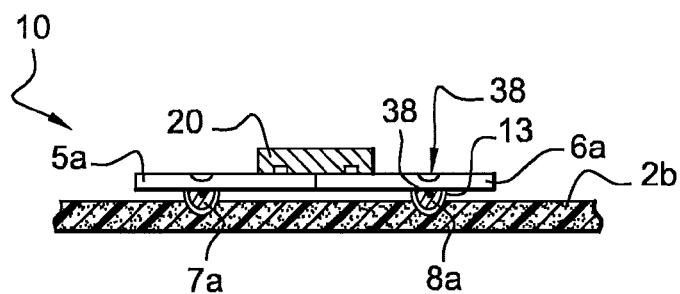
FIG. 4 shows a cross-sectional view of a second embodiment, the interconnecting wire being created from inlaid wire.

FIG. 4 shows a schematic view of another device 10, including at least one interconnecting wire 7a, 8b connected to the contact pads 5a, 6a on a substrate 2b and possibly obtained according to another embodiment of the invention. Here it is a module using an integrated circuit chip, 20 as a component.

The component 20 is transferred onto the interconnecting wires resting on the substrate. Here, these are wires created by overlaying a conductive wire onto a polymer sheet 2b. The conductive wire may be coated with a varnish or an insulating sheath 13.

Contrary to the prior art where the wire is connected by being positioned on a contact pad of a component already in place, the wire being placed between the pad and a thermo-compression tool, according to the invention, the terminal portion of connection 8a is first positioned on the substrate then the contact pad 6a is transferred there above and the welding energy is brought, particularly through thermo-compression through the contact pad whilst leaving a corresponding mark 38 there. This has the particular advantage of having an always clean welding surface for the welding tool.

Figure 5:
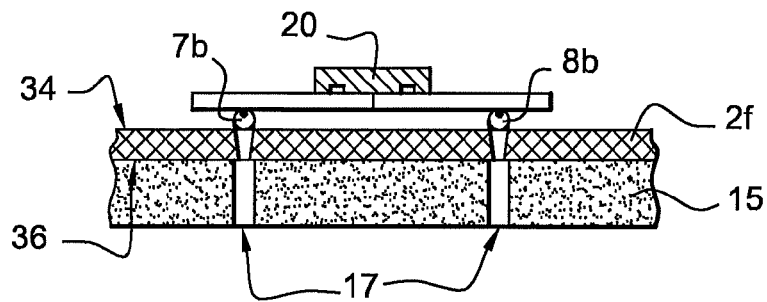
FIG. 5 shows a cross-sectional view of a third embodiment in which the behaviour of the substrate is reinforced with a sheet, the interconnecting wire being stitched on a woven fabric.

In FIG. 5, still with the same transfer configuration, the antenna is created using embroidering or sewing on a flexible support including a woven fabric 2f. The support is flexible in so far as it is not of good quality or rigid like all fine woven fabrics. The loose meshing (m) between the warp and weft yarns is for example between 200 μm and 300 μm in both directions), with a 80 μm thick or 48 dtex polyamide yarn. In addition, the woven fabric 2f is not stable in dimensions in so far as it can normally be stretched by hand especially diagonally for example by at least 3-20%. This elongation can be less than 1% in the direction of the travel of the substrate in the warp or weft direction, with a travel tension during production.

The handling of the woven fabric supporting an embroidered antenna being very delicate (flexible woven fabric material open between the meshes), the strengthening thereof is provided with a reinforcing material 15 in the form of a sheet or a layer, positioned on one face of the substrate facing that carrying the terminal portions of the antenna; a stabilising material 15 is fixed by adding a PVC, PET, Polycarbonate, Teslin or paper sheet.

Preferably, the reinforced sheet is added after the creation of the antenna or conductive track so as not to restrict the rate of production. However, it could be carried out beforehand, if necessary with less significant rates and risks of damaging the embroidering or sewing machine needles etc.

A similar effect to the adding of a sheet can be obtained by impregnating or coating a layer or spraying a product such as coating, primer, resin, polymer foam, and gum, able to stabilise the dimensions of the substrate.

The assembling can be carried out by lamination, thermal welding (fusion of materials) or addition of a (film, liquid) adhesive, with the substrate being very fine for reasons of productivity and facility of implementation.

This step also makes it possible to increase the thickness of the substrate in order to enable the reception of at least a part of one component in the support during the transfer of the latter.

The device comprises perforations 17, possibly partly closed, in the reinforcing material facing each connection and terminal portion 7b, 8b, connected as a result of using a very fine anvil or needle applied under the conductive wire to be connected and which perforates the material as subsequently explained.

Figure 6:
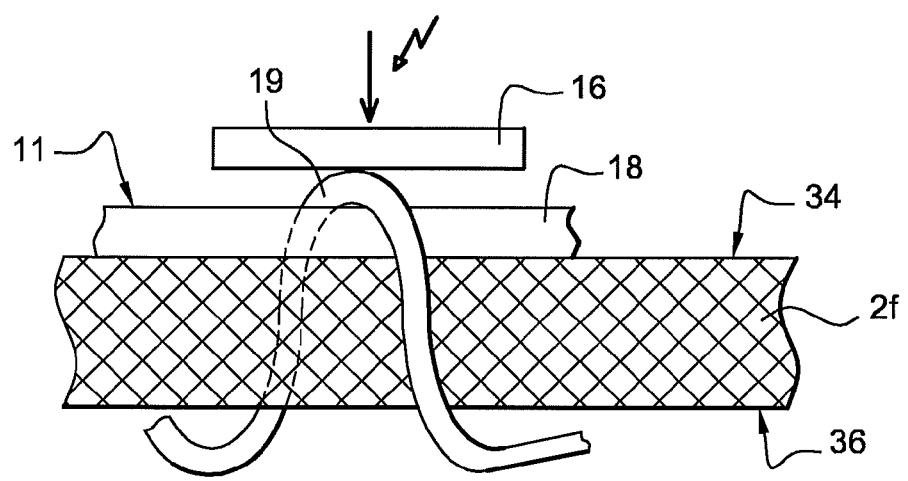
FIG. 6 shows a cross-sectional view of a fourth embodiment showing a connection with an embroidered antenna wire.
Figure 7:
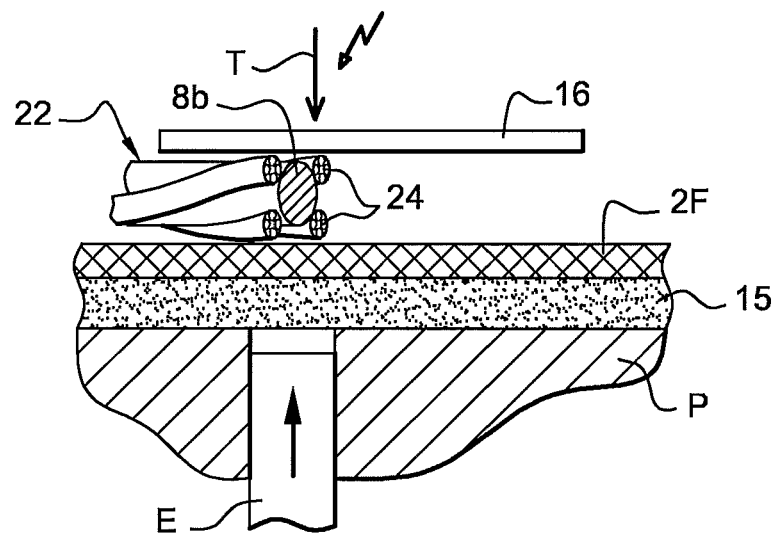
FIG. 7 shows a cross-sectional view of a fifth embodiment showing a connection with a hybrid antenna wire.

In FIG. 6 a single contact pad 16, not connected yet to a microcircuit or component is transferred to an interconnecting wire terminal portion, 18, embroidered with an embroidery yarn 19 for fixing the interconnecting wire on the fibre support 2f. The connection of a microcircuit 20 to a pad 16 can be carried out later by any known means, especially by flip-chip and conductive adhesive In FIG. 7 another embodiment of the device comprises a connection with a hybrid interconnecting wire, 22, in so far as the wire 3 is associated with 4 non-conductive wires 24; the association can however include at least one non-conductive wire 24. The non-conductive wires 24 are preferably thermofusible or thermoplastic ones in order to melt down under the thermal energy of thermo-compression or ultrasound energy.

Due to the presence of non-conductive wires 19 and 24, according to the invention, the tool (thermode) (T) is applied onto the metallic pad 16 which results in the melting down of the fixing wire and/or associated wire passing underneath and this without contamination of the welding tool. Preferably an anvil E will support the antenna wire during the connection.

Figure 8:
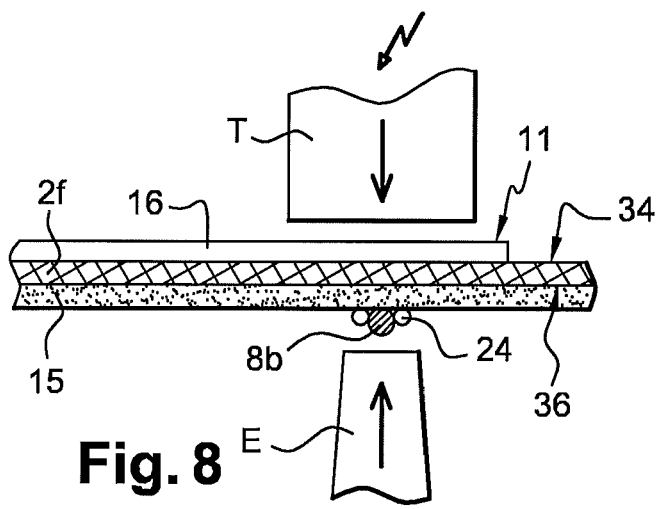
FIGS. 8 and 9 show another configuration of the pads facing the antenna wire and the connection thereof.
Figure 9:
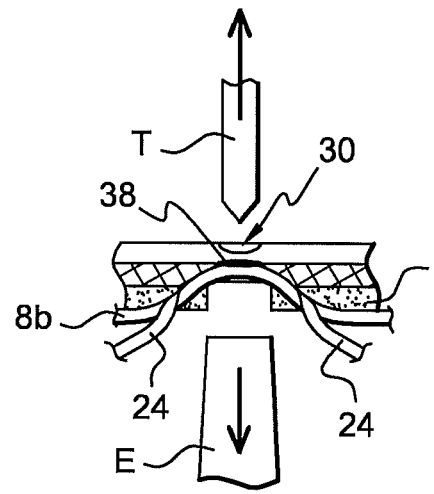

In FIGS. 8 and 9, another configuration of the device is such that the terminal portion of the interconnecting wire 8b is positioned in line with the pad but on the face of the support 15, or 2f (if the woven fabric can be handled) facing the contact pad 16. In this case the very fine anvil E pushes the antenna wire against the contact pad through the support by making the support material 15 creep and/or by separating the meshes from the fibre support 2f, whether or not associated with a reinforcing material 15.

Figure 10:
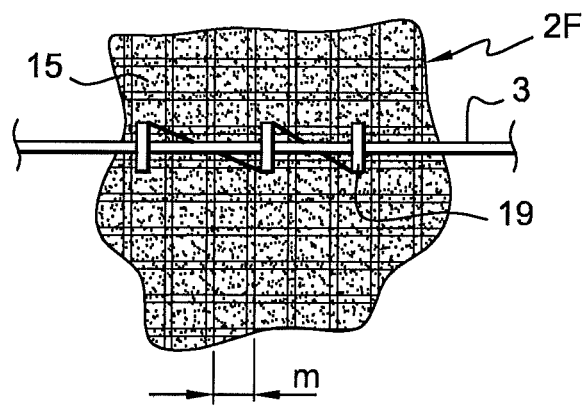
FIG. 10 shows en embroidered support with an antenna wire fixed by an embroidery yarn.

In FIG. 10, an example of woven fabric 2f can be seen as applicable for the invention and which comprises warp and weft yarns with loose meshes (m) between 200 μm and 300 μm and composed of 48 dtex polyamide wires. The interconnecting wire 3 is fixed by embroidering the woven fabric with the insulating wire 19.

Figure 11:
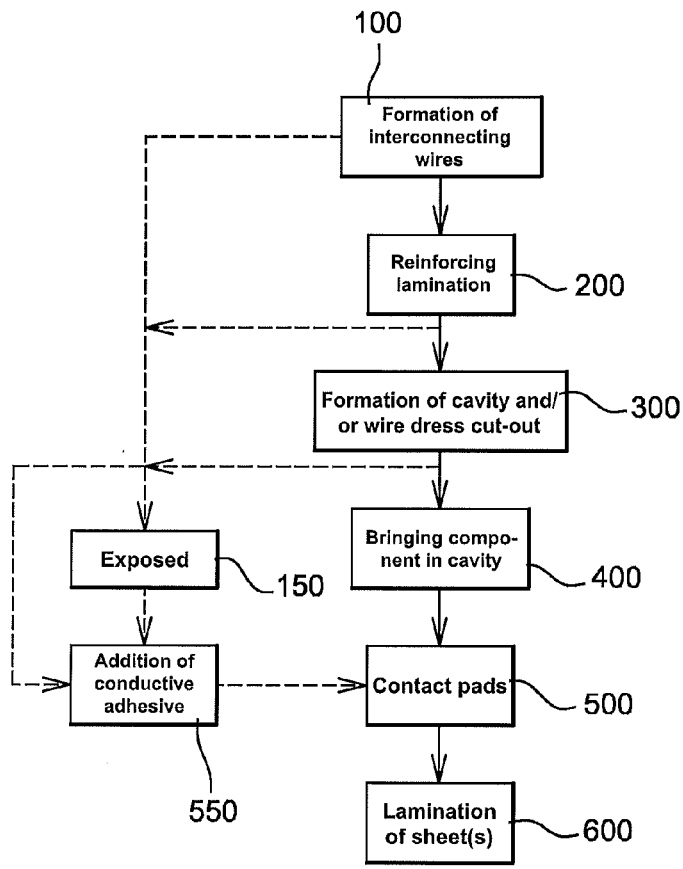
FIG. 11 shows the steps of the method according to preferred embodiments.

With reference to FIG. 11, a preferred embodiment of the method of the invention will now be described enabling the objectives to be met, but by first describing the problems met.

For the manufacture of low cost inserts including interconnecting wires, the inventors have specially chosen supports including interconnecting wires, for example stitched, embroidered or similar on to the support including woven fabrics.

In particular, when embroidering (especially for productivity and easy implementation) a plurality of antennas are first produced at the same time on embroidering machines, preferably on a woven or non woven or support fabric compatible with embroidering or sewing machines. During production, a support with a number of patterns of unconnected conductive wire portions will be obtained, as shown in FIG. 2.

However, materials suitable for being embroidered or sewn are not excluded, including, for example, other insulating substrates such as a film or a sheet made of polymer material, PVC, PET (polyethylene), paper, polyimide, synthetic leather especially those made of composite fibre/woven fabric composite and polymer sheet.

For reasons of discretion of the device subsequently laminated or added to an item, but also for reasons of productivity and easy sewing or embroidery, the support is a very fine woven fabric. The substrate of the final device may have different thicknesses, generally less than or equal to that of a 0.76 mm smart card so as to serve as inserts between two films or sheets or to serve as a support for a covering and/or printing sheet. Typically the substrate has a thickness between 0.1 mm and 0.5 mm.

The inventors noted lack of dimensional stability or rigidity of some substrates, more particularly made of woven fabric suited to this type of mass production, especially when these are continuous and travelling. This lack of rigidity makes it difficult or even impossible to precisely position electronic and electric components, microcircuits, contact pads or cavities especially by indexation on the substrate, before or after the creation of the interconnecting wires.

The addition of a sheet, reinforcing material or another woven fabric to the substrate, possibly with pre-defined cavities for receiving modules as imagined by the inventors, would bring dimensional stability to the substrate whilst also presenting some disadvantages: due to the lack of rigidity of the substrate and difficult indexation thereof, the cavities might be incorrectly positioned.

Adding the sheet before creating the interconnecting wires is not favourable to high embroidery output. On the contrary the addition of this reinforcement, without a cavity, would provide dimensional stability to the substrate, but this would increase the difficulty of ultrasound or thermo-compression connections in so far as there would be no cavity for introducing a chip or a module and moving the contact pads of terminal portions closer and establishing a good connection.

The inventors found that the electronic components or contact pads should preferably be transferred onto the substrate after the creation of the interconnecting wires or tracks for easy embroidering or sewing interconnecting wires, rate of production, difficult positioning and connecting of the component or the low-cost creation of the interconnecting wires.

In addition, the interconnecting wire can be sheathed with an insulating material especially in order to create an insulation bridge crossing the wires or can be associated with non-conductive wires or fibres for reasons of solidity, prevention of wire breakage or fixing on the support. In this case, the welding tool may be soiled or contaminated during the connection using ultrasound or thermo-compression welding since the welding tool (thermode) is applied directly onto the wire and is in contact with contaminated materials surrounding the wire in a configuration where the component is transferred next to or under the portions.

In addition, as the interconnecting wires rest on the substrate and the inventors have decided on bringing and connecting the pads over the antenna, the latter can tend to sink in the added sheet or fibrous mass under the pressure of welding means according to the type of materials used.

Taking these considerations into account, the method of figure has been developed as given hereunder.

In step 100, (FIG. 2), the embodiment of a device comprising at least one interconnecting wire connected to the contact pads of the component or for the component, comprises a step of supplying or creating a wire with terminal connection portions resting on the substrate.

The wire is preferably created by embroidering or sewing on a flexible substrate comprising a woven fabric.

The wire can at least comprise an insulation coating over its entire surface; it can also cumulatively or alternatively be in contact with insulating wires in places. The wire is fixed on the substrate with the help of a non-conductive wire, called the spool yarn or embroidering or sewing companion yarn.

Preferably, the wire is a hybrid wire associated with at least one non-conductive wire especially to allow a better rate without breakage of the wire.

This non-conductive wire surrounds the antenna wire at least in places and is a kind of insulating sheathing in places.

The non-conductive wire is preferably thermofusible or thermoplastic so that it can be removed or suppressed at the welding area.

Non thermofusible wires can be used when the weld energy is sufficient to suppress them, degrade them (or when a sufficient brazing material is added to go therethrough).

However, other techniques of fixing the conductive wire on a substrate can be selected from other less effective ones such as overlay.

Embroidering the antenna may preferably include a step of making a barring stitch (not shown) of sewing, embroidering or knitting interconnecting wire at the end of at least one of said terminal portions and preferably inside each dotted location EC1, EC2 . . . of the components C1, C2 . . . to be transferred; preferably followed by an elimination step of said barring stitch possibly comprising an elimination of the support material, at least opposite the barring stitch (PA), and possible formation of a cavity. The cavity may correspond either to the size of the component such that it can be embedded within, or only to barring stitch areas if the component does not have to be embedded.

The terminal portions of the interconnecting wire or barring stitches can be superimposed together or made in an area of the support meant to be removed. If a barring stitch is removed by punching, the corresponding terminal portion extends up to the edge of a cavity.

According to an alternative embodiment, a continuous wire pattern comprising at least or intended to form after cutting, two interconnecting wires, is provided, with the method comprising a step of executing a pattern comprising a continuous wire and a subsequent step of cutting the pattern to form the two interconnecting wires.

As previously indicated, the support is preferably a very fine woven fabric, but other fine supports can be considered.

Next, in step 200, according to a characteristic, the method may comprise a step according to which a reinforcing material in the form of a sheet or a layer is positioned on one face of the substrate facing the one carrying the terminal portions.

In the example, the reinforcing layer or sheet is placed directly after the creation of the antenna.

As already mentioned, an effect similar to the adding of a sheet can be obtained by impregnating or coating a layer or spraying a product such as coating, primer, a resin, polymer foam, gum, able to stabilise the dimensions of the substrate.

In step 300, with the substrate stabilised, it is possible to handle it and perform more conventional operations more particularly like more easily bringing contact pads onto the substrate.

However, according to another characteristic it is preferable to proceed to a step of forming a cavity in the substrate and/or reinforcing sheet or layer near the terminal portions of the antenna connections so as to insert the chip or module or component.

The cavity is made by punching but forming by pressure or drawing or another type of at least partial machining, of the substrate could be considered.

In step 400, the pads are transferred so as to have a surface facing a connection terminal portion resting on the substrate or facing a solid substrate portion (without a cavity). The invention is thus different from the prior art wherein, in order to connect an antenna, the antenna wire flies over a cavity meant for receiving the component and the connection pads. The pads have access to the wire through the cavity.

In the invention, when the wire is cut with the support, the terminal portion of the wire stops at the edge of the cavity that has been cut-out. The transferred contact pad is thus facing or is directly above a terminal portion, the latter also facing a support portion and not a cavity. If required, a chip can be transferred especially through flip-chip on the pads or rear face on the substrate or on a contact pad for a conventional connection by any known means, or even of the welded wire type.

The facing surface used in the description, corresponds to a projection of the longitudinal section of an interconnecting wire on a contact pad 8b, which is a rectangle with a width generally equal to the wire diameter and a length equal to the length of the pad covered on the facing side.

Preferably, the pads are already connected to an electronic component, such as a chip; the component is inserted at least partly in the cavity, with the pads remaining outside the cavity by resting on the terminal portions or terminal ends in turn resting on the support.

In step 500, the pads are connected to the terminal portions of the antenna; the connection can be made in the form of a welding by applying energy between the pads and the terminal portions, the welding energy is directly applied onto the pads with the help of a thermode for a thermocompression welding or an ultrasound probe for an ultrasonic welding.

For the welding, an anvil is preferably used that rests against the recess in the terminal portion of the antenna in the support. The anvil is all the more recommended since the interconnecting wire tends to sink into the substrate due to the fineness of the wire and/or softness of the substrate and/or the reinforcing material.

The anvil at least goes through the reinforcing sheet or layer facing the terminal portion to be connected such that the portion to be connected is supported by the anvil during the welding. The section of the anvil is rectangular or square with a section of 0.3×1 mm² to 1×5 mm².

The invention is applicable especially from the moment when a kind of "blind" connection of metallic pad must be made directly on a terminal portion of an interconnecting wire, which is also metallic and placed on a substrate that is not so hard as metal, by welding, with or without addition of brazing material, with the reverse being a conventional operation. A priori, at the time of welding, the pressure transmitted by a track or terminal portion onto the support thereof is much higher than the one transmitted by a pad on account of the ratio and the surface pressure. This is what discourages the man skilled in the art from choosing a connection configuration which is the reverse of the normal one.

As regards the sensitive component C1, C2, we proceed as follows:

As an alternative, the method comprises a step 550 of adding conductive adhesive between the connection terminal portions and the contacts of the components; this step can be performed directly after the creation of the interconnecting wires.

Figure 12:
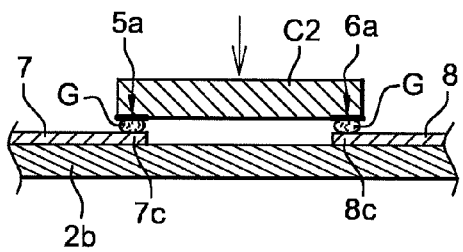
FIG. 12 shows another embodiment of the device and interconnection with bare wires.

In FIG. 12, the terminal portions 7c, 8c belong to an unsheathed or bare interconnecting wire and a component C2, C2 is transferred and connected through this adhesive directly after the tracks are created.

Figure 13:
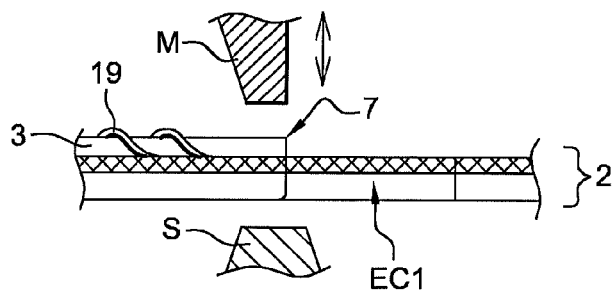
FIGS. 13-16 show another preferred embodiment of the device and interconnection with flat wires.
Figure 14:
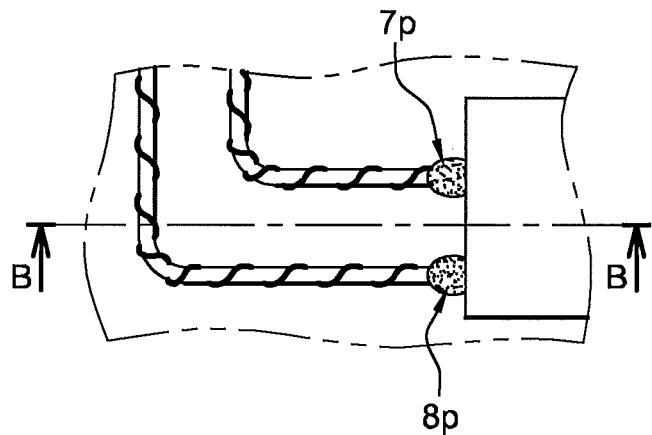

In step 150 and in FIGS. 13, 14, the terminal portion 7 is covered with an insulating material, and the method comprises a step of exposure, first or during the connection (for example by fusion). The exposure (to remove the enamel or insulating sheathing) can be done in different ways, especially, by flattening the terminal portion prior to the connection by various known means. For this purpose, any means that uses pressure, temperature and ultrasound can be used.

Here, a vibrating hammer M and a support S are used.

As a result one of the flattened connection terminal portions 7p, 8p (illustrated in FIG. 14 as a top view in FIG. 13) is obtained.

Figure 15:
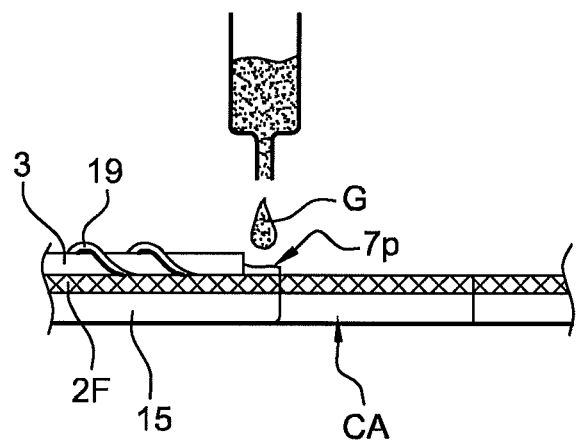

In FIG. 15, a conductive adhesive G, such as a drop, is added between the terminal portion 7b, 8b and the contact 5, 6 of a component or contact intended for connecting a component.

Figure 16:
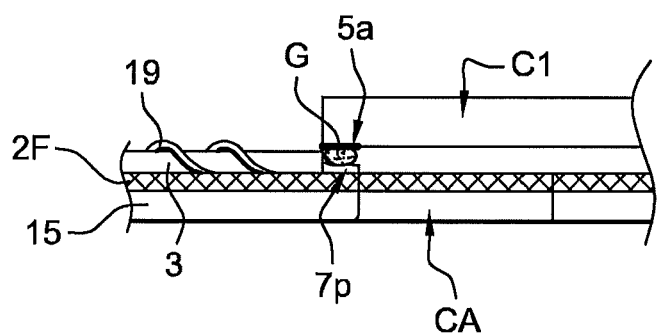

In FIG. 16 a component, for example C2, is transferred and connected through the conductive adhesive G to the terminal portions 7p, 8p. Here, the component is not embedded but a cavity CA for removing the barring stitch is planned. The interconnecting wire therefore stops at the edge of the cavity since it has been cut mainly by punching, at the same time as the substrate 2f and reinforcement 15.

In step 600, the support is assembled with at least one sheet on the side opposite the reinforcing sheet. The sheets may for example be made up of materials used for the passport sheets or covers or smart cards or other items. Next, it is cut at the required format. If required, the cutting can be done by another method.

If conductive wires are used as warp or weft yarns, according to mode III of the FIG. 3, travels at right angles are provided for. The connections of wires at the conductive warp/weft intersections are required and possible by any known means such as thermo-compression or according to the invention by flattening at the intersections and then connecting by using conductive adhesive.

The method according to the invention therefore comprises, in a preferred fast and simple embodiment, the formation of a plurality of continuous track or conductive wire patterns that are intended to form, after the cutting, interconnecting wires on a large size support, preferably by embroidering or sewing, the support being subsequently cut to form the basic supports comprising a pattern.

The patterns of a row may be connected with each other by the same wire.

The method preferably comprises the addition of a reinforcing material to the support.

Next, an operation of cutting the wires and forming cavities is performed.

Subsequently if required, using the same tool or at the same station, the terminal ends of each of the interconnecting wires is flattened in order to expose the connection portions, which can also be done before the wire is cut or the interconnecting wires are separated.

Each basic support is distinguished by cutting and is ready to supply other components bringing and interconnection stations.

The components are connected by being preferably placed in the cavities.

The invention claimed is:

1. A method for producing a device comprising at least two distinct components that are interconnected on a substrate by one interconnecting wire, wherein said method comprises the following steps:
   creating the interconnecting wire, including a terminal portion of the wire which is exposed on the substrate by virtue of its direct deposition on the substrate, by directly depositing individual wires on the substrate according to a predefined interconnecting pattern, said interconnecting wire including said terminal portion having a round cross-section,
   after the step of creating the interconnecting wire including the terminal portion of the wire by directly depositing individual wires on the substrate, moving at least one contact of a component relative to the substrate to thereby bring the at least one contact to face the terminal portion which is exposed on the substrate, and after the step of moving the at least one contact, connecting the at least one contact to this terminal portion.

2. A method according to claim 1, wherein, the terminal portion is coated with insulating material, and the method comprises a step of exposing the terminal portion first or during the connection.

3. A method according to claim 2, wherein the exposure is obtained by flattening the terminal portion prior to the connection.

4. A method according to claim 1, wherein the connection is made by a conductive adhesive applied between the terminal portion and the contact.

5. A method according to claim 1, wherein the connection is made by welding by way of thermo-compression or ultrasound.

6. A method according to claim 1, wherein the interconnecting wire is created by embroidering or sewing on a flexible substrate comprising a woven fabric, and further comprising a step of placing a reinforcing material in the form of a sheet or a layer on one face of the substrate to face the one that is carrying the terminal portion.

7. A method according to claim 6, wherein the reinforcing layer or sheet is placed after the interconnecting wire is created.

8. A method according to claim 7, wherein the method comprises a step of forming a cavity in the substrate and/or reinforcing sheet or layer near the terminal portion.

9. A method according to claim 1, wherein the interconnecting wire is a hybrid wire associated with at least one non-conductive wire.

10. A method according to claim 1, wherein in order to make at least two interconnecting wires, the method comprises a step of making a pattern comprising a continuous wire and a subsequent step of cutting the pattern to form at least the two interconnecting wires.

11. A device comprising at least two distinct components on a substrate, at least two contacts of each component interconnected by one interconnecting wire,
wherein the interconnecting wire, including a connecting terminal portion of the wire which is exposed on the substrate by virtue of its direct deposition on the substrate, is created by directly depositing a single continuous wire through a wiring technique onto the substrate,
at least one contact of a component being transferred to face the terminal portion which is exposed on the substrate and connected to this terminal portion so that the terminal portion is sandwiched between the at least one contact and the substrate,
wherein the interconnecting wire is created by embroidering or sewing on a flexible support comprising a woven fabric and that comprises a reinforcing material in the form of a sheet or a layer on one face of the substrate opposite the one carrying the terminal portion.

12. A device according to claim 11, wherein, the wire has an insulating sheath, and the terminal portion is exposed at the connection.

13. A device according to claim 12, wherein the terminal portion includes a flat portion at the connection.

14. A device according to claim 11, wherein the connection is made by a conductive adhesive applied between the terminal portion and the electric contact.

15. A device according to claim 11, wherein further comprising a cavity in the substrate and/or reinforcing sheet or layer near the terminal portion.

16. A device according to claim 15, wherein contact pads are associated with a component and face the substrate and the terminal portion resting on the substrate, and wherein the component is at least partially inserted in the cavity.

17. A device according to claim 11, wherein the interconnecting wire is a hybrid wire associated with at least one non-conductive wire.

18. A multi-component electronic product, such as a smart card, a passport comprising the device according to claim 11.

19. The multi-component product of claim 18, wherein said product is a smart card.

20. The multi-component product of claim 18, wherein said product is a passport.

21. A method for producing a device comprising at least two distinct components that are interconnected on a substrate by one interconnecting wire, wherein said method comprises the following steps:
creating the interconnecting wire, including a terminal portion of the wire which is exposed on the substrate by virtue of its direct deposition on the substrate, by directly depositing individual wires on the substrate according to a predefined interconnecting pattern,
after the step of creating the interconnecting wire including the terminal portion of the wire by directly depositing individual wires on the substrate, moving at least one contact of a component relative to the substrate to thereby bring the at least one contact to face the terminal portion which is exposed on the substrate, and
after the step of moving the at least one contact, connecting the at least one contact to this terminal portion,
wherein the connection is made by way of thermo-compression or ultrasound welding and uses an anvil which presses against a recess in the terminal portion and in that the anvil pierces, at least with one hole, a reinforcing sheet or layer opposite the terminal portion to be connected such that the portion to be connected is supported by the anvil during the welding.

\* \* \* \* \*